(12) United States Patent
van Schaijk et al.

(10) Patent No.: US 8,168,524 B2
(45) Date of Patent: May 1, 2012

(54) NON-VOLATILE MEMORY WITH ERASE GATE ON ISOLATION ZONES

(75) Inventors: Robertus T. F. van Schaijk, Eindhoven (NL); Michiel J. van Duuren, Valkenswaard (NL)

(73) Assignee: NXP B.V., Eindhoven (NL)

( * ) Notice: Subject to any disclaimer, the term of this patent is extended or adjusted under 35 U.S.C. 154(b) by 231 days.

(21) Appl. No.: 12/726,087

(22) Filed: Mar. 17, 2010

(65) Prior Publication Data
US 2010/0173488 A1    Jul. 8, 2010

Related U.S. Application Data

(62) Division of application No. 11/629,800, filed as application No. PCT/IB2005/051819 on Jun. 3, 2005, now Pat. No. 7,709,879.

(30) Foreign Application Priority Data

Jun. 15, 2004  (EP) .................................. 04102703

(51) Int. Cl.
*H01L 21/3205* (2006.01)
*H01L 21/4763* (2006.01)

(52) U.S. Cl. ........ 438/593; 438/201; 438/257; 257/314; 257/315; 257/316

(58) Field of Classification Search .................. 438/201, 438/257, 593; 257/314–316, E21.179, E21.209
See application file for complete search history.

(56) References Cited

U.S. PATENT DOCUMENTS

| | | | |
|---|---|---|---|
| 4,561,004 A | 12/1985 | Kuo et al. | |
| 5,331,188 A | 7/1994 | Acovic et al. | |
| 5,332,914 A | 7/1994 | Hazani et al. | |
| 6,204,126 B1 * | 3/2001 | Hsieh et al. | 438/267 |
| 6,420,232 B1 | 7/2002 | Wu | |
| 2001/0028578 A1 * | 10/2001 | Cunningham et al. | 365/185.28 |
| 2004/0065917 A1 | 4/2004 | Fan et al. | |
| 2004/0185614 A1 | 9/2004 | Ding | |

* cited by examiner

*Primary Examiner* — Theresa T Doan

(57) ABSTRACT

The present invention provides a non-volatile memory device and a method for manufacturing such a device. The device comprises a floating gate (16), a control gate (19) and a separate erase gate (10). The erase gate (10) is provided in or on isolation zones (2) provided in the substrate (1). Because of that, the erase gates (10) do not add to the cell size. The capacitance between the erase gate (10) and the floating gate (16) is small compared with the capacitance between the control gate (19) and the floating gate (16), and the charged floating gate (16) is erased by Fowler-Nordheim tunneling through the oxide layer between the erase gate (10) and the floating gate (16).

5 Claims, 12 Drawing Sheets

NON-VOLATILE MEMORY WITH ERASE GATE ON ISOLATION ZONES

The present invention relates to non-volatile memory (NVM) devices and a method for manufacturing and operating such devices. More particularly, the invention relates to non-volatile memories comprising an erase gate which is positioned in or on isolation zones in the substrate and a method of manufacturing and operating such devices.

Non-volatile memories (NVMs) are used in a wide variety of commercial and military electronic devices and equipment, such as e.g. hand-held telephones, radios and digital cameras. The market for these electronic devices continues to demand devices with a lower operating voltage, lower power consumption and a decreased chip size.

Flash memories or flash memory cells comprise a MOSFET with a floating gate (FG) or a plurality of floating gates between a control gate (CG) and a channel region, the floating gate(s) and the control gate being separated by a dielectric layer. With the improvement of fabrication technologies, the FG size has been reduced to dimensions of about 100 nm. These devices are basically miniature EEPROM cells in which electrons or holes are injected in a floating gate by means of tunneling through an oxide barrier. Charges stored in the FG modify the device threshold voltage. In this way, data is stored. The CG controls the potential of the FG. The CG to FG coupling ratio, which is related to the areal overlap between the FG and the CG, affects the read/write speed of the flash memory. Furthermore, the better, i.e. higher, the coupling ratio, the more the required operation voltage of the memory cell can be reduced.

Although the cell size of non-volatile FG cells has been decreasing continuously over the past years, the voltages needed for programming and erasing did not scale to the same extent. One of the main challenges for further scaling of non-volatile memories is thus the lowering of program and erase voltages. Nowadays, the generation of program/erase voltage in Fowler-Nordheim (FN) tunneling operation mode up to 15-20V becomes more and more difficult, especially for embedded NVM applications, due to lower supply voltages. This increases the area needed for high voltage generation and reduces the array efficiency. Therefore, low voltage program methods like source side injection become more important. Unfortunately, in most cases high voltages are still needed for erasing.

A known solution for the above problem is the use of an extra erase gate. A specific form of a flash EEPROM structure utilizes a separate erase gate in addition to the control gate. By using such separate erase gate, there is a further capacitive coupling between this erase gate and the floating gate, the erase gate being capacitively coupled to the floating gate through a tunnel dielectric which allows electrons to travel through it from the floating gate to the erase gate upon the correct combination of voltages being applied to the control gate, erase gate, source and drain. However, in case of such specific form of a flash EEPROM structure, the erase gate is used to increase the coupling between floating gate and erase gate in order to decrease the erase voltage. The concept of erase voltage reduction by increased coupling always adds considerably to the cell size and process complexity which is a disadvantage when downscaling NVMs.

U.S. Pat. No. 5,343,063 relates to programmable read only memory (PROM) cell structures and processes of making them, and in particular to erasable PROM (EPROM), electrically erasable PROM (EEPROM) and flash EEPROM cell structures. A device described is a split-channel type of device, i.e. the surface at the bottom of the floating gate extends across only a portion of the channel distance between the source and drain diffusions. That floating gate bottom surface, separated from the substrate by the gate oxide, acts as any other field effect transistor gate, that is, the potential on the floating gate determines whether electrons are permitted to travel across the substrate channel under the gate oxide layer between the source and the drain. The remaining portion of the channel has its conductivity controlled by a bottom surface of the control gate, and in effect, is a separately controlled field effect transistor in series with that formed by the floating gate.

In U.S. Pat. No. 5,343,063 a thick layer of dielectric is first deposited on the semiconductor substrate surface and then parallel-elongated trenches are etched in the dielectric until the substrate surface is showing at the bottom of the trenches. Individual memory cell devices are then formed in the trenches by building alternative layers of dielectric and electrically conductive polysilicon. The remaining dielectric between the trenches serves to electrically isolate the memory cells.

FIG. 1 illustrates one embodiment described in U.S. Pat. No. 5,343,063. The cell structure comprises individual floating gates 127, 129, and elongated control gates 137, 139 are provided in adjacent trenches in a thick field oxide layer 141 above the surface of a semiconductor substrate 143. In between the floating gates 127, 129 and the control gates 137, 139, an oxide layer 157 is provided. Erase gates 145, 147, 149 are buried in each thick oxide layer 141 and coupled to the floating gates 127, 129 in the trenches on the opposite sides of the thick oxide strip 141 in which the erase gate 145, 147, 149 is embedded. The erase gate 147, for example, is coupled with floating gates 127 and 129 by respective erase gate oxide layers 151, 153.

However, the device and method described in U.S. Pat. No. 5,343,063 have some disadvantages. The concept of U.S. Pat. No. 5,343,063 uses buried bitlines which have a high resistance. This means that frequently contacting the bitlines is required. Therefore, a lot of space is required in the memory cell, through which efficiency is strongly decreased. Furthermore, the method used for forming the slits in the control gate polysilicon en the use of spacers for etching the floating gate polysilicon, is not suitable for achieving structures with small dimensions as performance of lithography and etching of the floating gate in this case is hampered because of the large topography. Moreover, the insulation method with oxide lines is not compatible with standard CMOS insulation such as STI, due to the large topography. Through this, the cell structure described in U.S. Pat. No. 5,343,063 is less suitable for use in embedded memories, for instance, because when a large array of memory cells does not comprise STI and standard CMOS processing does so, then STI processing causes problems during CMP.

It is an object of the present invention to provide a non-volatile memory device with a separate erase gate which has small dimensions and overcomes the disadvantages of the prior art devices as well as a method of manufacturing and operating such a device.

The above objective is accomplished by a method and device according to the present invention.

In a first aspect of the invention, a semiconductor device is provided comprising:

a substrate having a substrate surface, at least two isolation zones in the substrate surface, the isolation zones having an outer surface away from the substrate, a floating gate extending on the substrate between and at least partially overlapping the two isolation zones, an erase gate, and a control gate over the floating gate and preferably over the erase gate, wherein the erase gate is formed on the outer surface of one of the isolation zones.

An advantage of the device according to the invention is that is does not add to the cell size. The capacitance between the erase gate and the floating gate is small compared with the capacitance between the control gate and the floating gate. The charged floating gate may be erased by Fowler-Nordheim tunneling through the oxide layer between the erase gate and the floating gate.

The isolation zones may be for example STI (shallow trench isolation) zones, which are preferred over LOCOS (local oxidation of silicon) regions, as they can be formed in a smaller dimension than that of LOCOS regions, which allows the reduction of the cell dimensions so that cell density can be increased.

The device may furthermore comprise an access gate and/or an insulating layer in between the floating gate and the control gate and in between the erase gate and the control gate.

According to the present invention, both 1-transistor (1-T) and 2-transistor (2-T) cells and compact cells with or without self-aligned access gate may be provided. The semiconductor device according to the invention may comprise an access gate comprising two conductive layers which are electrically connected to each other. The device according may furthermore comprise slits separating adjacent floating gates and running over substantially the complete width of the array.

Furthermore, non-volatile memories (NVMs) are disclosed including the semiconductor device according to the invention. The NVMs may for example be a flash memory or an EEPROM.

In a second aspect of the invention, a method is provided for the manufacturing of a semiconductor device comprising an erase gate, a floating gate and a control gate. The method comprises:

providing a substrate having a substrate surface with at least two isolation zones having an outer surface away from the substrate, forming a floating gate extending on the substrate between and at least partially overlapping the two isolation zones, forming an erase gate on the outer surface of one of the isolation zones, and forming a control gate over the floating gate and preferably over the erase gate.

By using the method according to this invention, non-volatile memories may be achieved with small dimensions and with small capacitive coupling between the erase gate and the floating gate.

The isolation zones may be provided as STI zones which are preferred over LOCOS zones because they can be made in smaller dimensions.

The erase gate on the outer surface of the isolation zones may be formed by depositing and pattering a first conductive layer, which may preferably be a polysilicon layer. The floating gate may be formed by depositing and patterning a second conductive layer, which may preferably also be a polysilicon layer in order to form slits in the second conductive layer in order to separate adjacent floating gates. Patterning may be performed by etching slits such that the slits run over substantially the complete width of the substrate. The method may furthermore comprise depositing a dielectric layer on top of the second conductive layer and partially removing the dielectric layer at that position where the access gate is to be formed.

Forming the control gate may be performed by depositing a third conductive layer over the floating gate and the erase gate and patterning the third conductive layer. The third conductive layer may preferably be a polysilicon layer.

The method according to the invention may furthermore comprise providing an insulating layer on top of the floating gate and the erase gate before forming the control gate. Furthermore, the method may comprise forming an access gate.

In one embodiment according to this invention, the insulating layer may be removed at the position where the access gate has to be formed, prior to forming of the control gate. This leads to long continuous non-interrupted erase gates which do not hamper proper operation of the non-volatile memory cell. This is because the interrupted floating gate material is bypassed by the control gate material on top of the erase gate, so that the access gates are electrically continuous structures.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
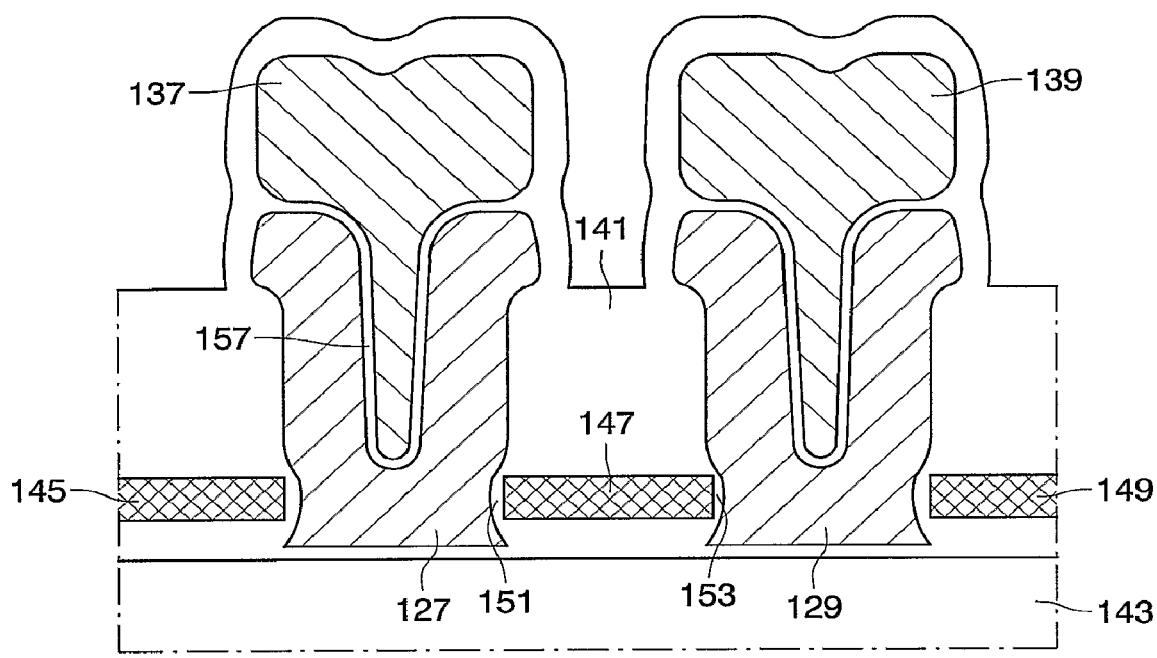
FIG. 1 is a sectional view of a NVM device according to the prior art.

In the different figures, the same reference figures refer to the same or analogous elements.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

It is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

The present invention provides a non-volatile memory (NVM) device comprising an erase gate (EG) and a method for the manufacture of such a device. According to the present invention, the EG is located on or in shallow trench isolation (STI) in so-called slits providing floating gate(FG)-to-floating gate isolation, and preferably does not add to the cell size. Hence, the invention describes a way to combine low program voltage method with a low erase voltage by using an EG and combines the advantages of an extra EG, leading to low erase voltages, with simple processing without increased cell size.

According to a first embodiment of the present invention, an NVM cell comprising an EG on top of the STI is described. FIGS. 2 to 10 illustrate subsequent process steps in the manufacture of such a memory cell.

The processing starts with providing a substrate 1 with isolation zones 2. In embodiments of the present invention, the term "substrate" may include any underlying material or materials that may be used, or upon which a device, a circuit or an epitaxial layer may be formed. In other alternative embodiments, this "substrate" may include a semiconductor substrate such as e.g. a doped silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or a $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest. Also, the "substrate" may be any other base on which a layer is formed, for example a glass, plastic or metal layer. The following description of the invention will be done by means of a mono-crystalline silicone substrate, but this is, however, not intended to be limiting the invention.

The isolation zones 2 may, for example, be shallow trench isolation (STI) zones or thermally grown field oxide (LOCOS—Local Oxidation of Silicon) regions. However, STI zones are preferred over LOCOS regions as they can be formed in a smaller dimension than that of the LOCOS regions, which allows the reduction of the cell dimensions, so that cell density can be increased. Therefore, in the following description, only STI zones 2 are further considered, but it should be understood that the present invention includes the process steps described below carried out with for example LOCOS regions as well.

Figure 2:
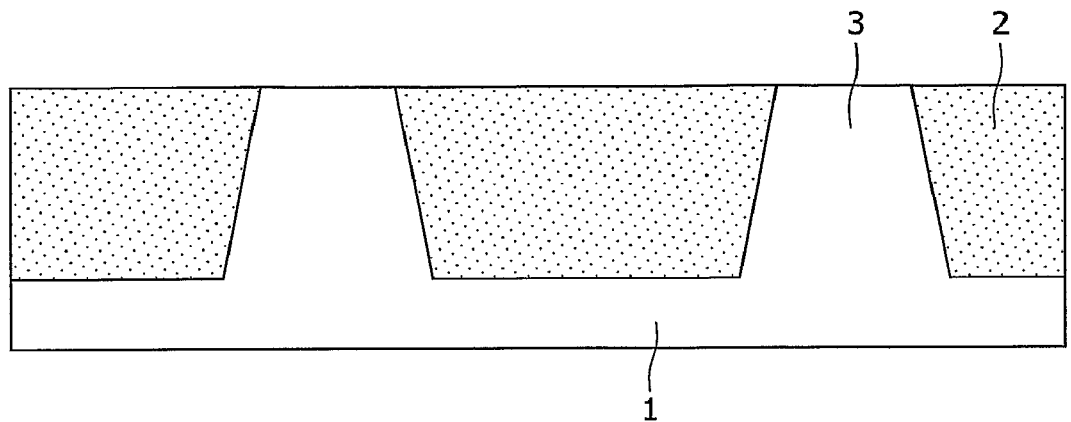
FIGS. 2 to 8 show cross-sectional views of successive stages in the manufacture of a non-volatile memory cell according to a first embodiment of the present invention.

In the present invention, as illustrated in FIG. 2, a substrate 1 is provided with STI zones 2, in order to isolate subsequent memory cells from each other. Between two STI zones 2, an active area 3 is formed in the remaining substrate 1.

STI zones 2 may be formed by initially creating a shallow trench in the semiconductor substrate 1, e.g. by a conventional photolithographic and anisotropic etch process such as a dry etch process, e.g. reactive ion etching (RIE) procedure, using e.g. $Cl_2$ as etchant. The shallow trench is created to a depth of, for example, between about 200 to 600 nm in the semiconductor substrate 1 (not shown in the figures). After removal of the photoresist pattern used for shallow trench definition, e.g. by plasma oxygen ashing and careful wet cleans, an insulating layer such as a silicon oxide layer is deposited, for example by a low pressure chemical vapor deposition (LPCVD) procedure or by a plasma enhanced chemical vapor deposition (PECVD) procedure or other procedure, to a thickness between about 300 to 1500 nm. The shallow trenches are thus completely filled. Removal of the insulating material, silicon oxide in the example given, from regions other than inside the shallow trenches is accomplished using any suitable technique such as either a chemical mechanical polishing (CMP) procedure, or via a RIE procedure using a suitable etchant, resulting in insulator filled STI zones 2.

If instead of STI zones 2, LOCOS isolation zones would be provided in the substrate 1, they may be formed via initially forming an oxidation resistant mask, such as silicon nitride, then exposing regions of the semiconductor substrate not protected by the silicon nitride masking pattern, to a thermal oxidation procedure. LOCOS isolation zones are thus created at a thickness equal to the depth of STI regions 2. After formation of the LOCOS region, the oxidation resistant mask is removed.

Figure 3:
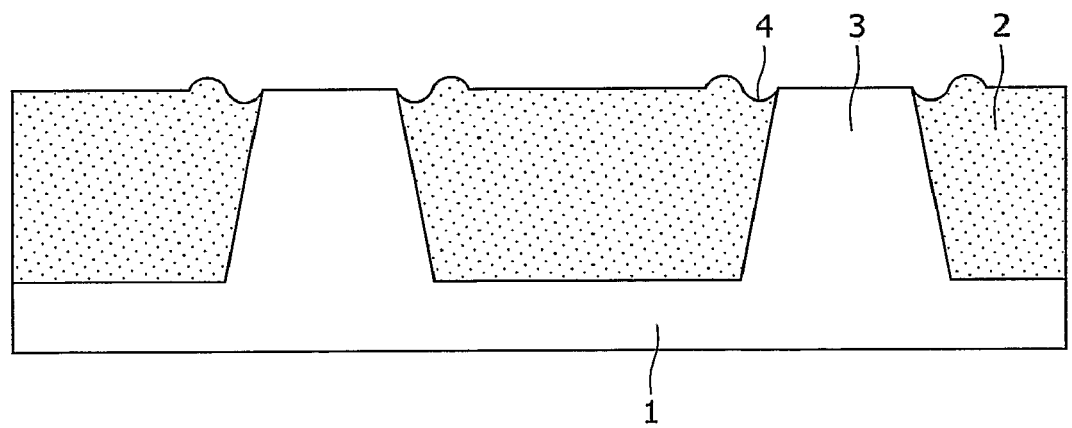

Although STI zones 2 are preferred over LOCOS isolation zones 2, the processing of STI zones 2 has the disadvantage that it may introduce topography on the substrate 1, as illustrated in FIG. 3. This topography can introduce etch problems in the further processing of the non-volatile memory. As can be seen from FIG. 3, STI can give rise to ditches 4 next to the active area 3. These ditches 4 are formed during the etching back of the insulating layer formed in order to level the insulating layer in the trench to the same height as the active areas 3. When a memory stack, comprising a floating gate (FG) and a control gate (CG) (see further) is deposited onto the formed STI topography, this topography remains due to conformal deposition of, for example, polysilicon layers. This problem can be overcome by preliminary removal of the STI topography, for example by using chemical mechanical polishing (CMP) after the deposition of the floating gate material (see further). The STI topography will then not be introduced to the next layer(s).

Figure 4:
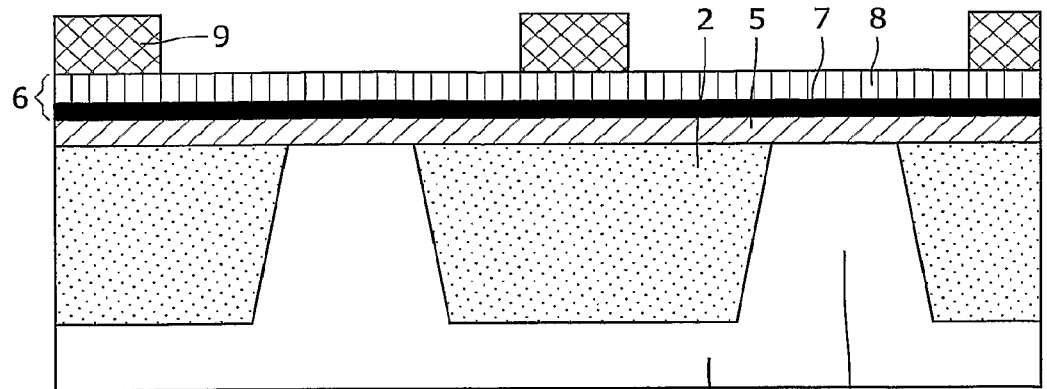

A next step in the manufacturing of the NVM device according to the first embodiment of the present invention is erase gate (EG) formation, which is illustrated in FIG. 4. Therefore, a first conductive layer 5, which may preferably be a polysilicon layer and which will in the further description be referred to as erase gate (EG) layer 5, is deposited. The EG layer 5 may preferably have a thickness not larger than 50 nm, preferably between 10 nm and 40 nm, more preferred about 20 nm. On top of the EG layer 5, an insulating cap layer 6 is provided with a thickness of about 100 nm. The thickness of the EG layer 5 and the cap layer 6 together will, later on, determine the thickness of the FG. Hence, the thickness of the cap layer 6 may be adapted to achieve the required FG height. Thus, if one wants a particular FG height, and the EG layer 5 gets thinner, the thickness of the cap layer 6 should be increased in order to achieve the required FG height. The cap layer 6 may consist of a plurality of layers, for example it may comprise a first, thin, cap layer 7, such as an oxide layer with a thickness of between, for example, 10 and 30 nm, e.g. 20 nm and a second, thicker, cap layer 8, such as a nitride layer with a thickness of about 80 nm. The first, thin, cap layer 7 preferably is of the same order of thickness as the thickness of the tunnel oxide (see further), so as to avoid unwanted currents through this first, thin, cap layer 7. The second, thicker, cap layer 8 may serve as to provide the required height of the combination of EG and cap. Instead of a combined oxide/nitride cap layer 6, in further embodiments, a cap layer 6 only consisting of a single insulating layer such as a nitride layer may also be used. This means that only a nitride layer is deposited on top of the EG layer 5. Another possibility to form the cap layer 6 comprising an oxide layer 7 and a nitride layer 8 is oxidation of the EG layer 5 after deposition of this EG layer 5 but prior to patterning of the EG layer 5, which means that no oxide deposition is necessary before subsequent deposition of a nitride cap layer 8. An advantage of the latter method is the fact that part of the EG layer 5 is transformed into oxide, leaving a thinner polysilicon layer for the EG. This makes it easier to obtain an EG layer 5 with a thickness in the range of for example 10 nm. This is advantageous as it is difficult to obtain a uniform, thin polysilicon layer of about 10 nm by deposition of polysilicon.

Thereafter, a masking layer, such as a photoresist layer, is applied to the structure so far obtained, e.g. by means of spincoating, or by any other suitable technique, and is exposed so as to form an erase gate mask 9. This may be done by for example standard photolithography or by any other suitable technique. The photoresist layer may, for example, have a thickness of a few microns an may be made of any suitable polymer that can be used as a photoresist such as for example poly(vinyl cinnamate) or novolak-based polymers. Thereafter, a mask is applied to align a pattern onto the substrate so far obtained. The photoresist layer is then illuminated through the mask e.g. by means of UV light. After illumination the photoresist is developed by which either the illuminated parts of the photoresist (in case of positive resist) or the non-illuminated part of the photoresist (in case of negative resist) are removed, depending on which type of photoresist has been used. The result after this step is illustrated in FIG. 4. The erase gate 10 can have a critical dimension (CD), i.e. the dimension of the smallest geometrical features which can be formed during semiconductor device manufacturing using a given technology or, by using tricks known to a person skilled in the art, even smaller. One possibility for smaller CD is when forming the EG mask 9, after development of the resist, using a resist shrink (e.g. UV bake) or resist ash (e.g. $O_2$-plasma) so as to shrink the dimensions of the remaining parts of the EG mask 9. Especially the resist shrink is a reliable and very cheap and easy way to achieve sub-lithographic dimensions. The CD can be reduced with this technique about 30 to 50 nm. Smaller dimensions may be obtained with phase-shift lithography.

Patterning of the EG layer 5, with the cap layer 6 on top thereof, is then performed using the developed photoresist layer as the EG mask 9. During this etching step, the EG layer 5 and the cap layer 6 are removed outside the range of the erase gate mask 9 (FIG. 5) and in that way an erase gate 10 with on top a first cap 11 and a second cap 12 is formed. In this embodiment the first cap 11 may be an oxide cap and the second cap 12 may be a nitride cap. If only one material has been used for the cap layer 6, then only one cap (not illustrated in the drawings) remains on top of the erase gate 10. Thereafter, the remaining parts of the photoresist layer are removed, typically by using an organic solvent. Still another option for size reduction of the erase gate 10 can be a short isotropic over-etch of the EG layer 5 after resist strip of the cap layer 6. The cap layer 6 may then be used as a hard-mask for the subsequent etch for etching the EG layer 5.

Figure 5:
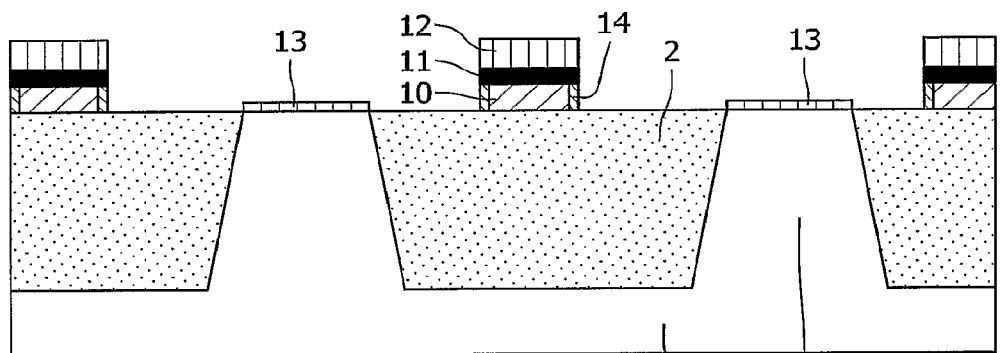

In a further step, a tunnel oxide 13 is grown onto the active area 3 of the substrate 1. The tunnel oxide 13 may preferably have a thickness of between 6 and 15 nm, e.g. 8 nm. During this oxidation step, an erase gate oxide 14 is formed at the free surfaces, i.e. side surfaces of the erase gate 10. The erase gate oxide 14 will be thicker than the tunnel oxide 13 due to doping dependent increased oxidation, since the highly doped polysilicon of EG layer 5 has a higher oxidation rate than the lower doped mono-crystalline silicon substrate 1. The erase gate oxide 14 will later form the insulation between the floating gate (see further) and the erase gate 10 and will be used for tunneling during erase. The result after these steps is illustrated in FIG. 5.

Figure 6:
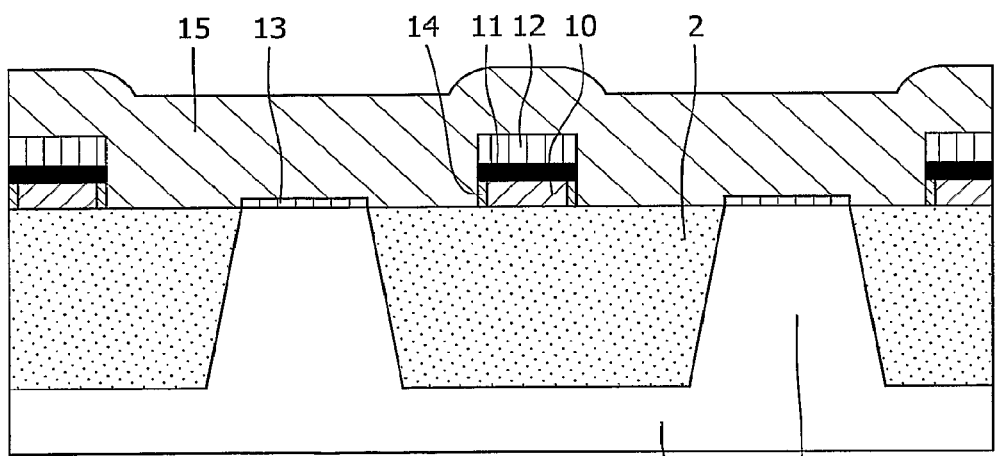

In a next step, illustrated in FIG. 6, a second conductive layer is deposited. The second conductive layer may be, in this embodiment, for example polysilicon and will be further referred to as the FG layer 15, as in a later step, the floating gate will be formed out of this FG layer 15.

Figure 7:
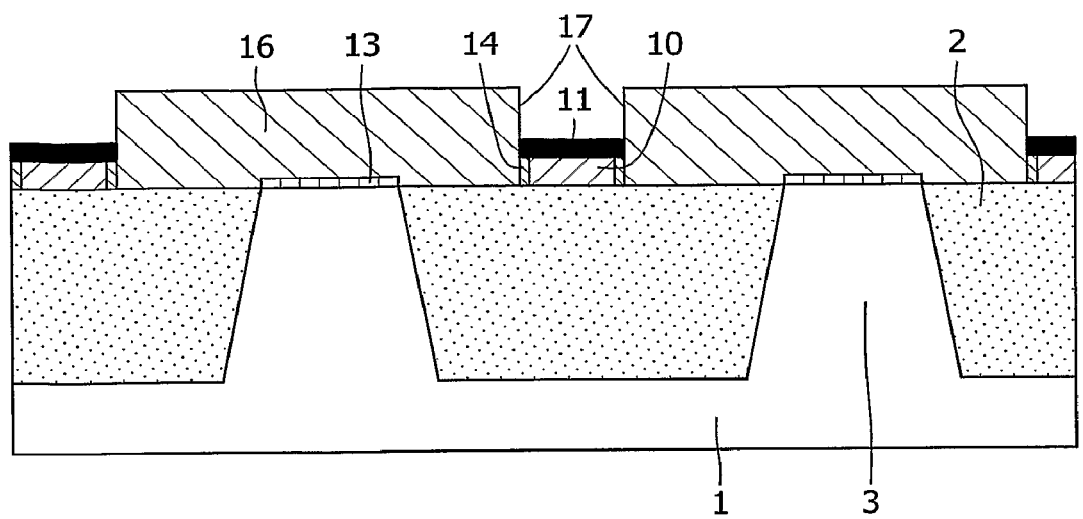

The FG layer 15 is then removed, e.g. by polishing, for example by poly-CMP, down to the top of the cap on top of the EG 10, for example down to the second cap 12, which in the present embodiment is a nitride cap. After polishing, part of the cap on top of the EG 10 may be removed, for example the second cap 12 on top of the erase gate 10 may be removed. In case of the example given, where the second cap 12 is a nitride cap, this removal may, for example, be performed by immersion into $H_3PO_4$. The first cap 11, which in this embodiment is an oxide cap, will hereby function as a stopping layer. In that way the floating gate 16 is formed, as illustrated in FIG. 7. In case the cap layer 6 comprises only a thick nitride layer, only part of this nitride cap layer 6 may be removed after poly-CMP of the FG layer 15. This is, however, not really necessary. In case none of the material, e.g. nitride, of the cap layer 6 is removed, the risk of EG attack during subsequent etching of the FG 16/control gate (CG) (see further) stack or access gate (AG) (see further) is reduced. On the other hand, the coupling between the CG and the FG 16 may also be reduced because of the lack of sidewall coupling, which results in a higher voltage needed on the CG during programming.

Then, implantation of the polysilicon of the FG 16 may be performed. In principle, this implantation may be also performed before the removal of the second cap 12. However, in this embodiment it is preferred to do it after the removal of the second cap 12, because, in the example given, the second cap 12 is a nitride cap and first removing the nitride cap 12 prevents the attack of $n^+$ doped FG polysilicon by the $H_3PO_4$ which is used for the nitride etch. The attack of the FG polysilicon during the nitride etch step can also occur if in-situ doped polysilicon is used. The result after polishing the FG layer 15 and removing the second cap 12 is illustrated in FIG. 7. It can be seen that the FGs 16 comprise additional sidewalls 17 extending above the top of the EG 10. These additional sidewalls 17 will add to the coupling between the FG 16 and the CG to be formed later.

Figure 8:
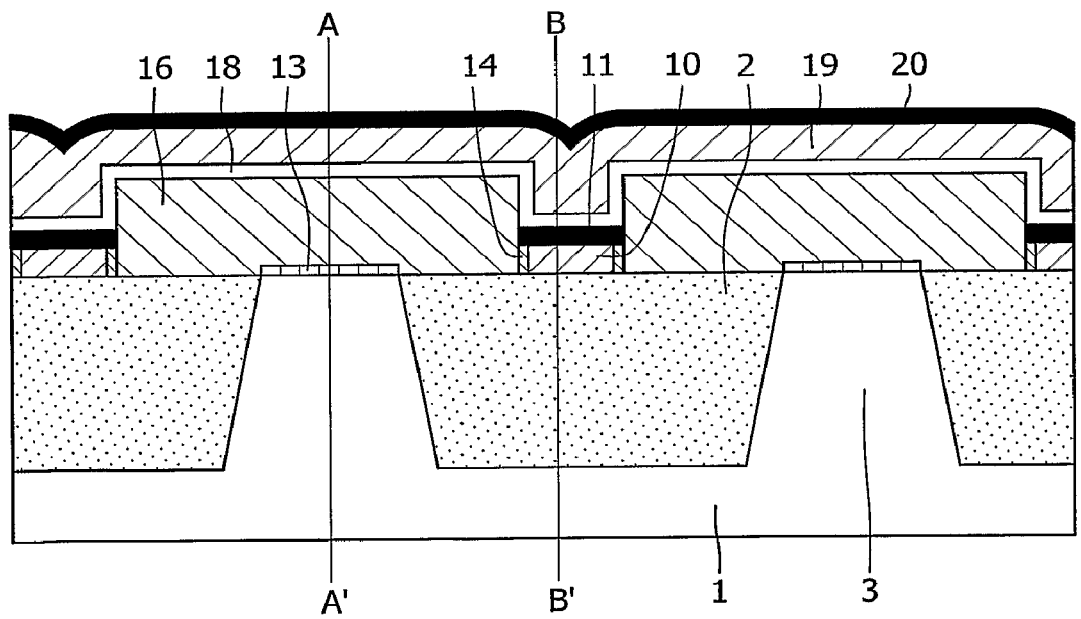

During further processing, a dielectric layer 18 is deposited on top of the complete structure as obtained up to now, which is shown in FIG. 7. This is illustrated in FIG. 8. In the further description, the dielectric layer 18 will be referred to as inter-poly-dielectric layer (IPD) 18, as, in the example given, the conductive layers used preferably are formed out of polysilicon. The IPD 18 preferably comprises a plurality of insulating materials, e.g. an Oxide Nitride Oxide (ONO) layer, and may be formed or grown by conventional techniques. An ONO layer preferably comprises successive layers of silicon dioxide, silicon nitride and silicon dioxide. The total dielectric thickness of the ONO layer may generally be between about 10 to 50 nm. The IPD may, however, also be formed out of more advanced materials may be used such as e.g. $HfO_2$ or $Al_2O_5$. These materials show higher k-values than ONO, i.e. for a same thickness they give rise to a higher capacitance and hence, a higher CG-to-FG coupling, with respect to ONO. On top of the IPD layer 18, a second conductive layer 19, which preferably may be a polysilicon layer and which will further be referred to as the control gate (CG) layer 19, is deposited. The deposition of the CG layer 19 may, for example, be performed by LPCVD procedures, to a thickness between about 50 to 400 nm. Doping of the CG layer 19 may either be accomplished in situ, during deposition, via the addition of a suitable dopant impurities such as arsine or phosphine to a silane ambient, or via an ion implantation procedure, using such a dopant, e.g. arsenic, phosphorous or boron ions applied to an intrinsic polysilicon layer. On top of the CG layer 19, an extra cap layer 20 is deposited. The extra cap layer 20 may for example be a nitride layer and may have a thickness of between 40 and 200 nm and may preferably be about 100 nm.

Next, gate stacks 23, each comprising the extra cap layer 20, CG layer 19, the IPD 18 and the FG 16, are etched. During this stack etching, the first cap 11, in the example given an oxide cap, on top of the erase gate 10 should not be removed, or at least not completely, in order to be able to later on form the access gate 22. The result so far is illustrated in FIG. 8, which shows a cross-section in the wordline direction of the NVM device according to the first embodiment of the present invention.

Figure 9:
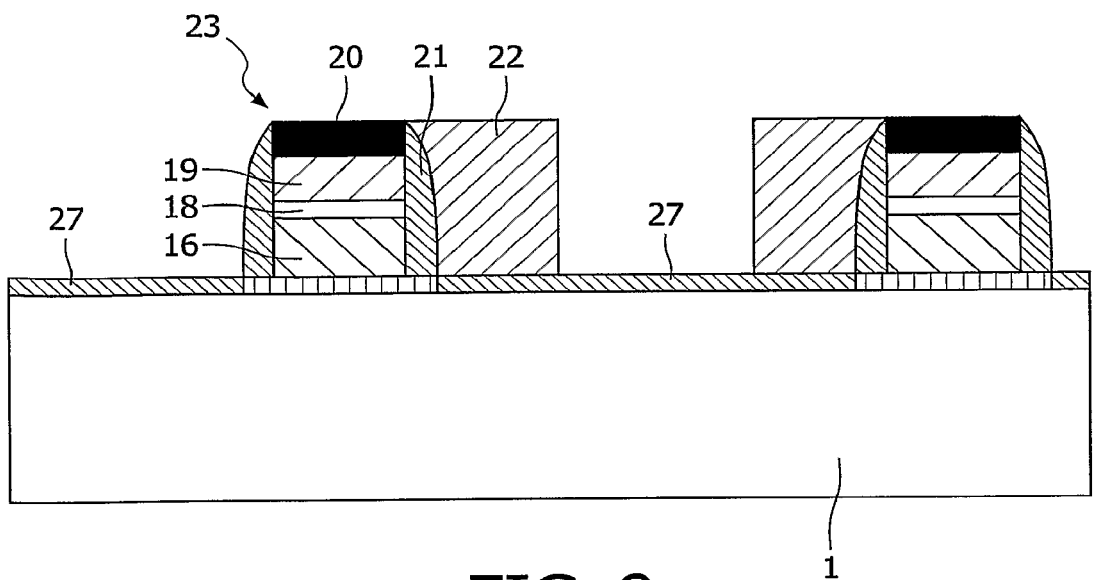
FIG. 9 is a cross-section according to the line A-A' in FIG. 8.

Spacers 21 may then be formed next to the FG 16/IPD 18/CG 19 stacks 23 (see FIG. 9, which is a cross-section at the line A-A' in FIG. 8). The spacers 21 may be formed by for example depositing and subsequently etching insulating material, for example oxide such as e.g. TEOS or HTO. The spacer etch also removes exposed parts of the tunnel oxide layer 13, i.e. parts not covered by the gate stacks 23, and ends at substrate 1 height. That way a stacked gate or double gate stack is formed. Preferably, the device is cleaned, so as to expose the surface of the silicon substrate 1 where no gate stack 23 is present. Then, an access gate insulator, such as an access gate oxide 27, is grown onto the substrate 1.

In a next step, a fourth conductive layer (not represented in the drawings), which may, for example, be a polysilicon layer which is doped in-situ or by implantation or by a combination of both, is deposited. This fourth conductive layer may for example have a thickness of 450 nm, but may have any other thickness, which is preferably higher than the height of the gate stack 23. The thickness of the fourth conductive layer is reduced, for example by chemical mechanical polishing (CMP), either down to the same height as the gate stack 23 or just above the gate stack 23. Other techniques may also be used to remove superfluous parts of the fourth conductive layer. If polycrystalline silicon is applied for the fourth conductive layer, the extra cap layer 20 of the gate stacks 23 is advantageously composed of for example silicon nitride. The extra cap layer 20 may later be used as a stopping layer during CMP and/or during (back) etching of the access gate 22 described below to prevent attack of the CG 19.

Figure 10:
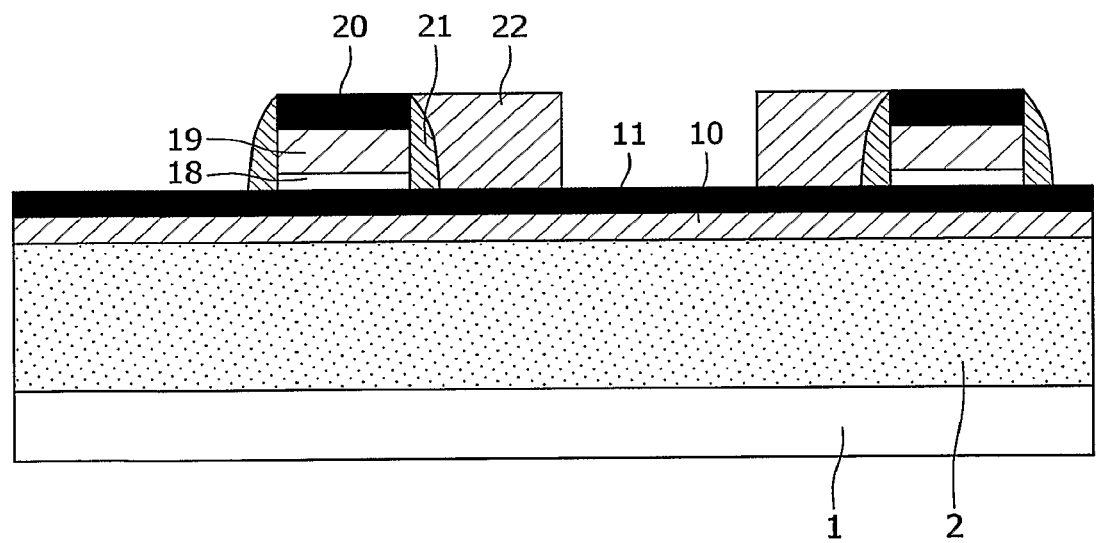
FIG. 10 is a cross-section according to the line B-B' in FIG. 8.

Then, a mask (not represented in the drawings) is applied which covers parts of the fourth conductive layer in between two gate stacks 23 where later access gates 22 will be formed, as illustrated in FIG. 9. The mask may be formed from any material which is suitable in view of the materials used for processing the memory device. The mask is used to etch the fourth conductive layer at some locations where no access gate 22 will be present, the etch being selective towards the AG oxide 27, the spacers 21, the extra cap layer 20 and the remaining portion of cap layer 6, e.g. first cap 11. After etching of the fourth conductive layer and removal of the mask, the structure looks as shown in FIGS. 9 and 10. FIGS. 9 and 10 show cross-sections of the structure of the non-volatile memory device according to the first embodiment of the present invention and according to resp. AA' and BB' as indicated on FIG. 8.

In the example explained above, an AG mask is used to pattern the AG 22. However, a self-aligned approach may also be used.

Cell formation is finalized with standard processing as known by a person skilled in the art like MDD, HDD offset spacers, MDD implants, silicidation and backend processing.

Figure 11:
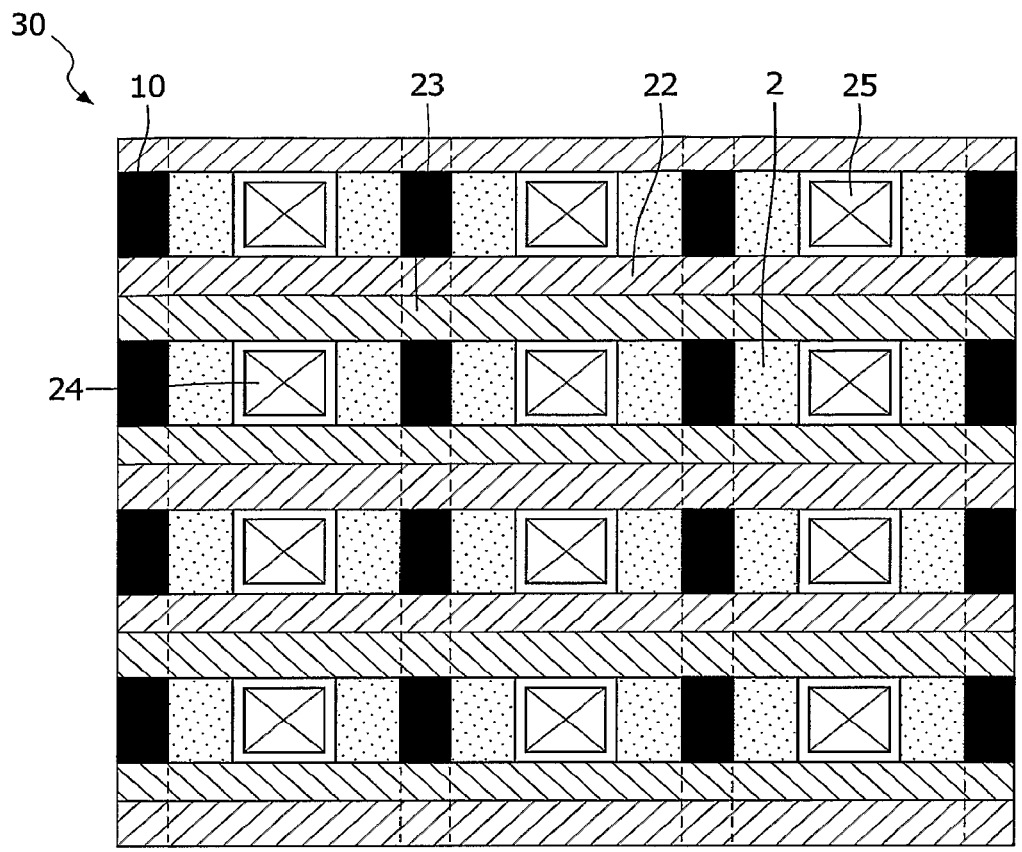
FIG. 11 is a top view of an embodiment of an array configuration of non-volatile memory cells according to an embodiment of the present invention.

FIG. 11 illustrates a top view of a possible array configuration 30, i.e. a common source NOR with separate source-side selection transistor for each cell, the array configuration 30 comprising a plurality of NVM devices according to the present invention, illustrating the configuration of EG 10, FG/CG stack 23 and STI zones 2. Furthermore, the position of the bitline contacts 24 and source contacts 25 are shown. The sizes of the devices drawn in the figure are not on scale. It has furthermore to be noted that the only purpose of FIG. 11 is illustration and hence that it is not limiting the invention.

It is thus possible, with a first embodiment of the method according to the present invention, to achieve a non-volatile memory device comprising an EG 10 on top of an isolation zone 2 such as an STI or LOCOS or similar zone, which EG 10 is separated from a FG 16 by means of an insulator such as a poly-oxide or EG oxide 14. Since the area of this insulator 14 is relatively small, the capacitive coupling between the EG 10 and the FG 16 is small. As a consequence, a positive voltage applied to the EG 10 will result in a large field in the insulator, e.g. EG oxide 14, causing Fowler-Nordheim (FN) tunneling of electrons from the FG 16 to the EG 10, through the EG oxide 14. In this way, the erase voltage can be reduced, and, moreover, a positive voltage on the EG 10 can be used for erasing (instead of a negative voltage on the CG 19), allowing for positive-voltage only operation of the cell, which has advantages for the size and complexity of the periphery.

A memory cell according to the present invention may be programmed with source side injection (SSI) with 3-6V on the drain, 1-2V on the AG 22 and 6-10 V on the CG 19. SSI is an efficient, low power programming method, which can be used in all cell concepts with merged CG/FG stack 23 and AG 22. Also channel hot electron (CHE) programming could be used with 3-6V on drain and 8-12V on CG 19. In principle another array configuration without AG 22 can be used for CHE.

Because of the low coupling between the EG 10 and the FG 16, the voltage on the EG 10 will cause a high electric field across the EG oxide 14 between the EG 10 and the FG 16. With a voltage of 8-12V on the EG 10, Fowler-Nordheim tunneling from the FG 16 towards the EG 10 is possible. When prior art devices without EG 10 are used, Fowler-Nordheim erase will need voltages between 15V and 20V. This higher voltage is due to the voltage loss because of the not 100% coupling between the FG and the CG. In these cases, in general, the coupling between the CG 19 and the FG 16 is about 50 to 60%.

Figure 12A:
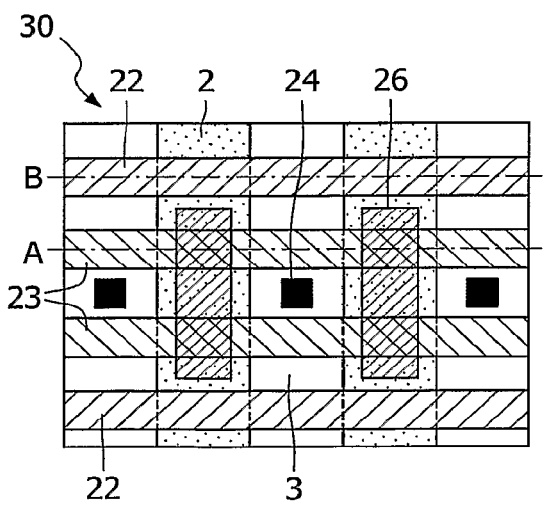
FIG. 12a is a top view and FIG. 12b illustrates a cross-section of a standard 2-T cell with standard ('short') slits.
Figure 12B:
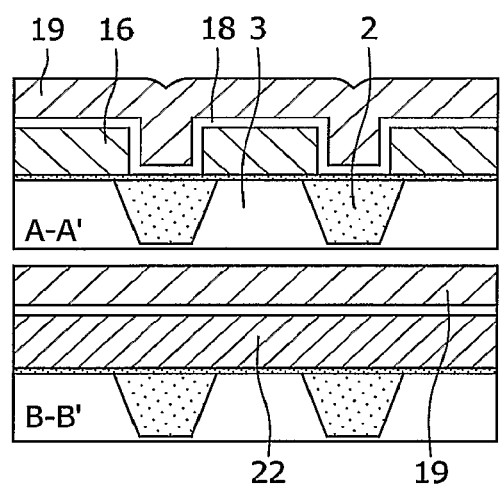
Figure 13A:
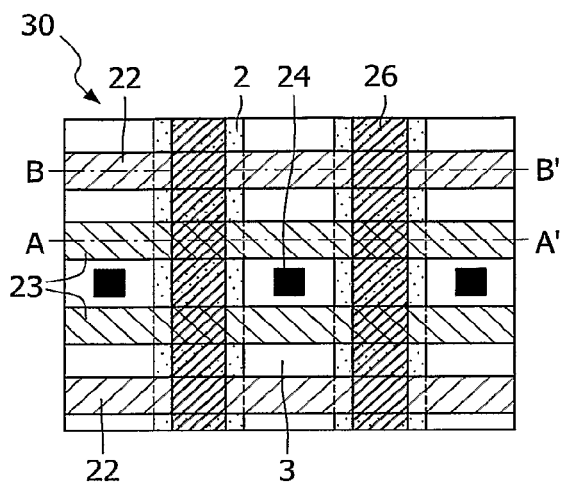
FIG. 13a is a top view and FIG. 13b illustrates a cross-section of a standard 2-T cell with 'long' slits.
Figure 13B:
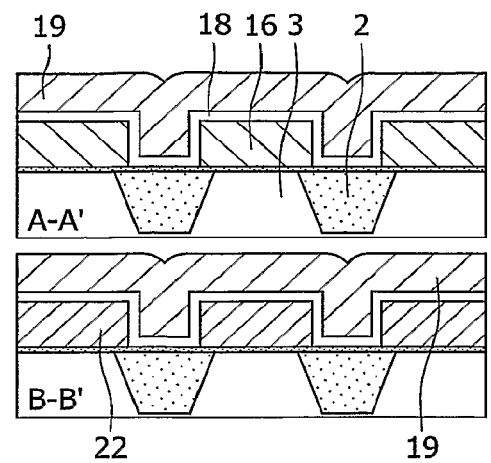

A drawback, however, of the above described EG concept is that it may not be directly suited for discrete 2-transistor (2-T) cells in which the AG 22 is formed by a CG/FG stack with contacted FG poly. In this case, the AG 22, which in that case are made of FG conductive material, e.g. FG polysilicon, would be cut. Furthermore, the method is not very well suited for the manufacturing of compact cells with self-aligned AG 22, because when the EG 10 on STI 2 is too high, AG's 22 will be formed alongside the EG's 10, thus causing shorts of adjacent parallel AG's 22. For the manufacturing of compact cells with self-aligned access gate, starting from the situations as illustrated in FIG. 9 but without the AG 22, an AG 22 may be formed 'automatically' against all vertical side-walls, i.e. at both sides of the CG/FG stack 23, by using spacers. As the EG 10 also has vertical sidewalls, AG poly silicon will be present at these sidewalls. This leads to AG-AG short circuits. The electrical shorts hence comprise polysilicon traces which go along the EG 10 from AG 22 to AG 22, at both sides of the source contact 25. In a second embodiment, a way of using the EG concept of the first embodiment for manufacturing of a 2-T cell is described. FIG. 12a shows a top view of part of an array 30 comprising conventional 2-T cells and FIG. 12b shows a cross-section of a conventional 2-T cell in which adjacent floating gates 16 on the same word line are separated by means of a so-called slit mask 26. This slit mask 26 is not extended to the AG area, since it would cut the FG material which also serves as the AG 22, as can be seen in FIGS. 13a and 13b. Of course, with such an interrupted AG 22, the array 30 cannot be used.

Figure 14A:
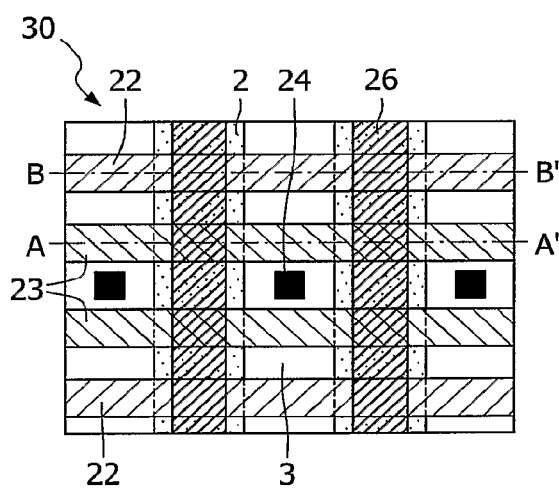
FIG. 14a is a top view and FIG. 14b illustrates a cross-section of a standard 2-T cell with EG processing.
Figure 14B:
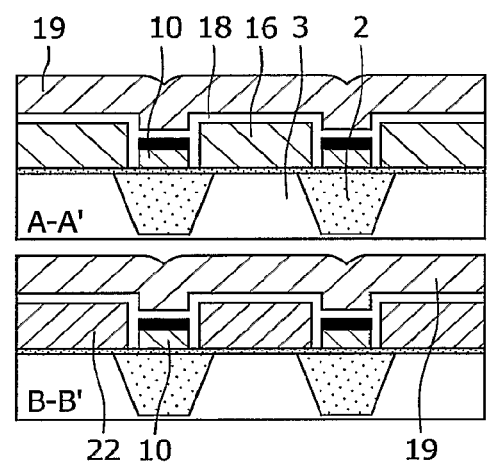

If the 2-T cell would be combined with an EG 10, the EG 10 should preferably always be a continuous non-interrupted long line. In exactly the same way as in FIG. 13b, use of such EGs 10 in a 2-T cell would lead to unconnected AGs 22, as illustrated in FIGS. 14a and 14b. FIG. 14a shows a top view of part of an array comprising standard 2-T cells with EG-processing and FIG. 14b shows a cross-section of a standard 2-T cell with EG-processing. In this case, the AG 22 is electrically discontinuous, in analogy with the case as shown in FIG. 13b. It can be concluded that an EG 10 would cut the AG 22 and therefore, the EG-concept is not compatible with the standard 2-T approach of the first embodiment of the present invention.

A solution to overcome the problem as stated above, is now illustrated in FIGS. 15 and 16 as an embodiment of the present invention. FIG. 15 illustrates part of an array with 'modified' 2-T cells, without EG, but with long slits 26 between adjacent FGs 16. The cells may, however, also be made with short slits, but this is unnecessarily complex. The modified 2-T cells may be formed as follows.

The first steps of the formation of a 'modified' 2-T cell do not differ from the formation of a standard 2-T cell. This means that first a substrate 1 is provided with isolation zones 2 such as e.g. STI zones in order to isolate subsequent memory cells from each other. Between two STI zones 2, an active area 3 is formed in the remaining substrate 1. Substrate implants are then carried out, e.g. through a sacrificial oxide layer, after which the sacrificial oxide layer is removed. In a further step, a tunnel oxide 13 is grown onto the active area 3 of the substrate 1. A layer of FG material is applied, for example deposited, on top of the tunnel oxide 13. FG slits are then etched in order to separate adjacent FGs, which etching stops on the STI oxide. The FG slit mask 26 now consists of long lines overlying the entire array 30. Thereafter an IPD layer 18 is deposited, e.g. an ONO stack with an EOT of 10 to 20 nm, preferably about 15 nm.

Figure 15A:
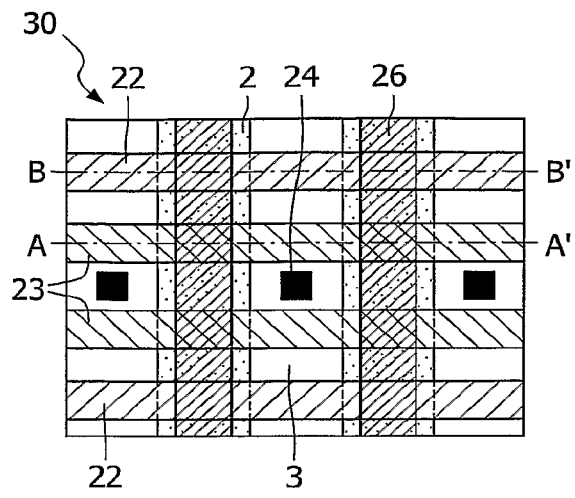
FIG. 15a is a top view and FIG. 15b illustrates a cross-section of a modified 2-T cell with 'long' slits.
Figure 15B:
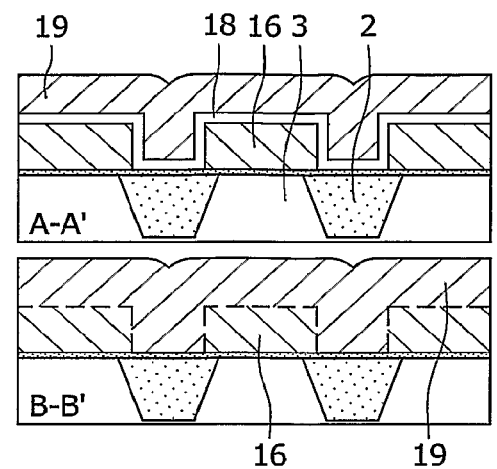

After IPD formation, the IPD layer 18 has to be removed selectively at the sites where, later on, the AG 22 will be defined. The IPD layer 18 may be removed by means of for example wet or dry etching, whereby it is not necessary that the IPD is completely removed from the sidewalls. For reliability reasons, it may be beneficial to deposit a thin buffer layer of a suitable material such as e.g. polysilicon on top of the IPD layer 18 prior to photoresist application for removal of portions of the IPD layer 18. In this way, it is not necessary to do resist processing directly on top of the IPD layer 18 which could cause reliability hazards. Optionally, this buffer layer could even be used as a hard mask for the IPD etch. After the IPD etching step and removal of the resist, the rest of the processing as for a standard 2-T cell may be resumed, starting with deposition of the CG layer 19. A CG/FG stack is etched, thus defining the CG/FG and the AC lines. CG material and IPD are removed where FG contacts will be made later on. A side walls oxidation is performed, and MDD implant, HDD offset spacer formation, and HDD implant are carried out. Thereafter exposed active areas in the substrate and exposed conductive layers (CG and FG) are salicidated, and further back-end processing is carried out. In that way, a 'modified' 2-T cell or 2-T cell with modified AG 22 may be formed, as illustrated in FIGS. 15a and 15b (without EG) and FIGS. 16a and 16b (with EG).

Figure 16A:
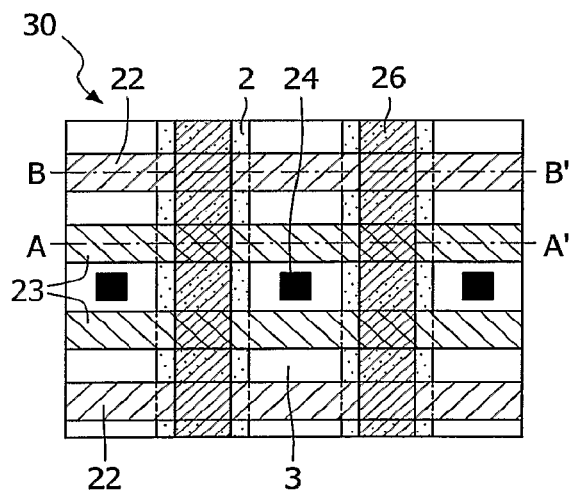
FIG. 16a is a top view and FIG. 16b illustrates a cross-section of a modified 2-T cell with EG processing according to an embodiment of the present invention.
Figure 16B:
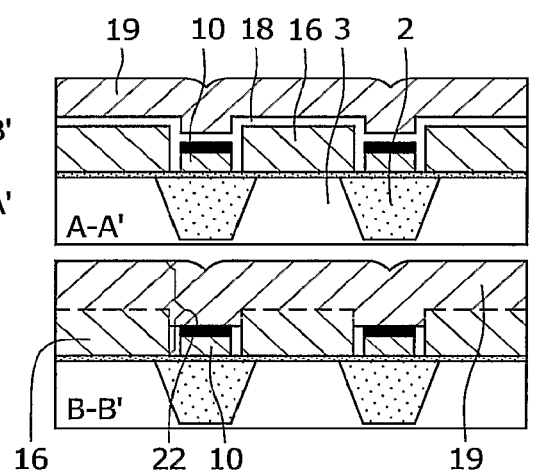

In the modified 2-T cell according to the second embodiment of the invention, long continuous EG 10 do not hamper proper operation of the 2-T cell, which is illustrated in FIGS. 16a and 16b. The reason is that the interrupted FG conductive material 16 is bypassed by the CG 19 on top of the EG's 10, so that the AG's 22 are continuous. Thus, despite the long slits 26, the AG 22 is electrically continuous, and hence does not cause malfunctioning of the device, which is an advantage of the modified 2-T approach, according to the second embodiment of the invention.

In the first and second embodiment of the invention, the EG 10 is formed in the bitline direction, on top of the STI 2, replacing the conventional slits that separate adjacent floating gates 16. In a third embodiment of the present invention, the EG 10 also runs in the bitline direction, but now is located in the STI 2 instead. Hereinafter, the subsequent process steps during manufacturing of a non-volatile memory according to the third embodiment will be discussed. It should be noted, however, that this is only a very rough process flow, skipping 'details' well known by a person skilled in the art, like e.g. sacrificial oxide for well implantation etc. The concept of this third embodiment is, contrary to the first and second embodiment, compatible for the formation of compact cells with self-aligned AG.

Figure 17:
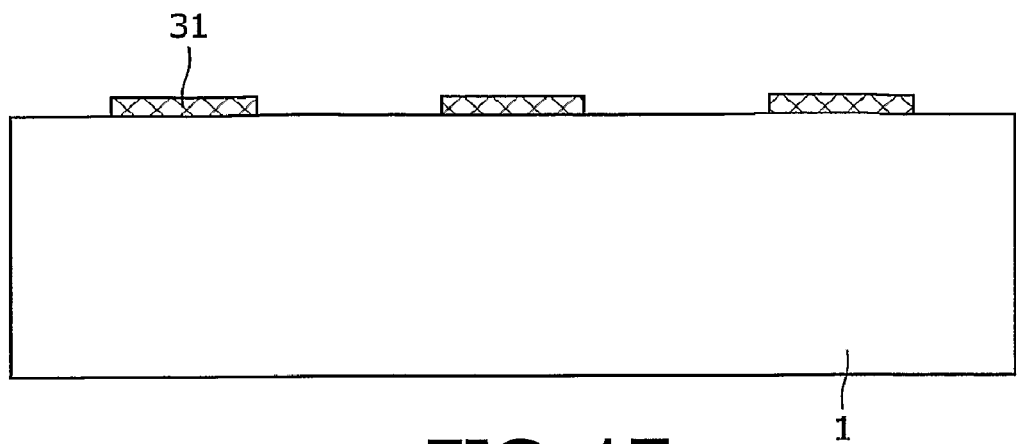
FIGS. 17 to 27 show cross-sectional views of the successive stages in the manufacture of a non-volatile memory cell according to a further embodiment of the present invention.

In a first step, onto a substrate 1, which may for example be silicon or any other suitable substrate as set out in the first embodiment, a hard mask 31 is deposited. This is illustrated in FIG. 17. The hard mask 31 will, later on, define the active area 3 of the device (see FIG. 18). This first step is a standard step, i.e. providing the so-called direct-STI modules 2. Preferably, the hard mask 31 may comprise nitride on a pad oxide.

Figure 18:
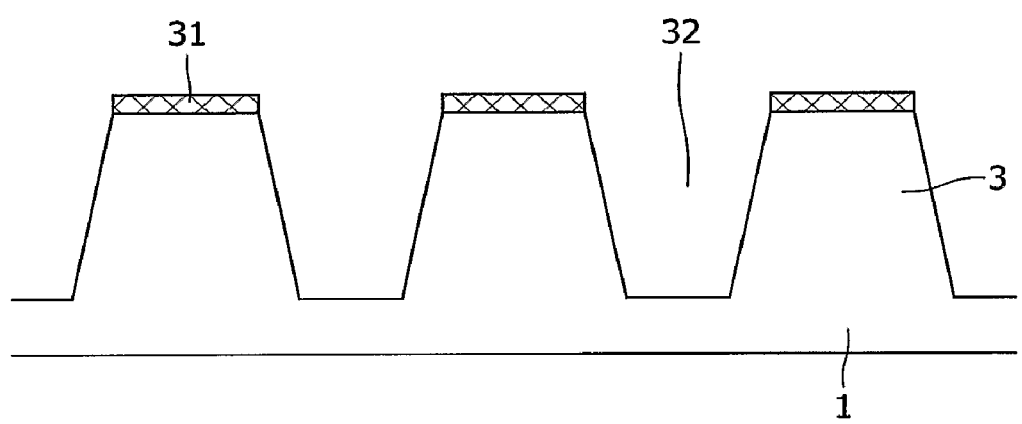

In a next step, the hard mask 31 is used to etch trenches or slits 32 in the substrate 1. In that way, as illustrated in FIG. 18, active areas 3 are formed in the substrate 1. The trenches or slits 32 will define the field regions of the NVM device. Up till now, the process according to the present invention follows the usual process steps as performed in a standard STI processes.

Figure 19:
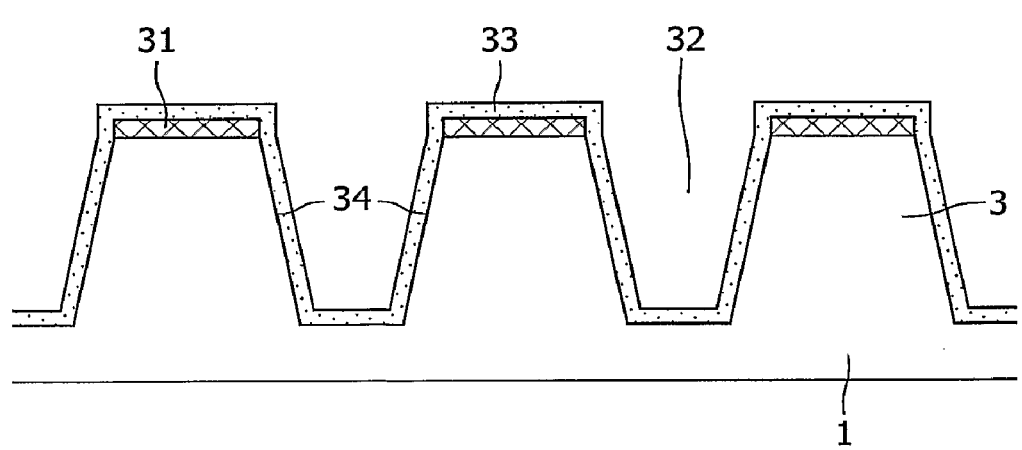

In a further step, the trenches or slits 32 are partly, not completely, filled with an insulating layer 33, as illustrated in FIG. 19. The insulating layer 33 may for example be a combination of thermally grown and deposited oxides. In this step, the deviation from a standard STI method begins. In standard STI processes, the trenches 32 are entirely filled with oxide. The insulating layer 33 may preferably have a thickness of between 10 nm and 50 nm. The insulating layer 33 should on the one hand be thick enough to prevent any parasitic transistor action along the sidewalls 34 of the trenches 32. On the other hand, the insulating layer 33 should also be thin enough not to fill up the complete trench 32. Hence, the trenches 32 partly filled with the insulating layer 33 now form the STI zones 2 in the substrate 1. In the further process, erase gates 10 will be formed in these STI zones 2 as will be set out hereinafter.

Figure 20:
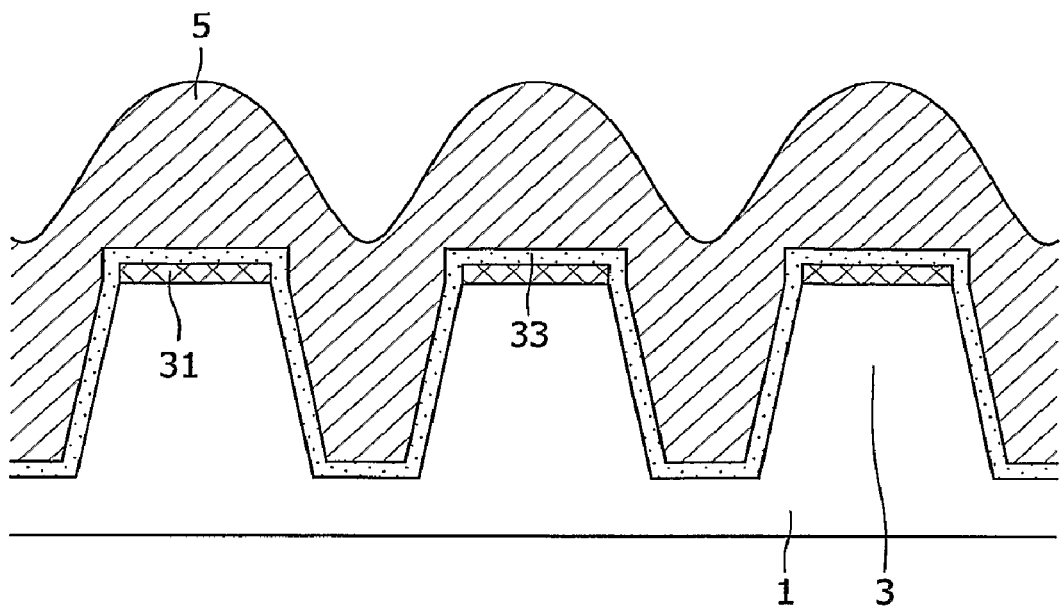

After deposition of the insulating layer 33, a first conductive layer 5 is deposited in order to fill the rest of the trenches 32, as shown in FIG. 20. The first conductive layer 5 may for example be in-situ doped polysilicon and will further be referred to as the EG layer 5. Later on, EGs will be formed from this EG layer 5.

Figure 21:
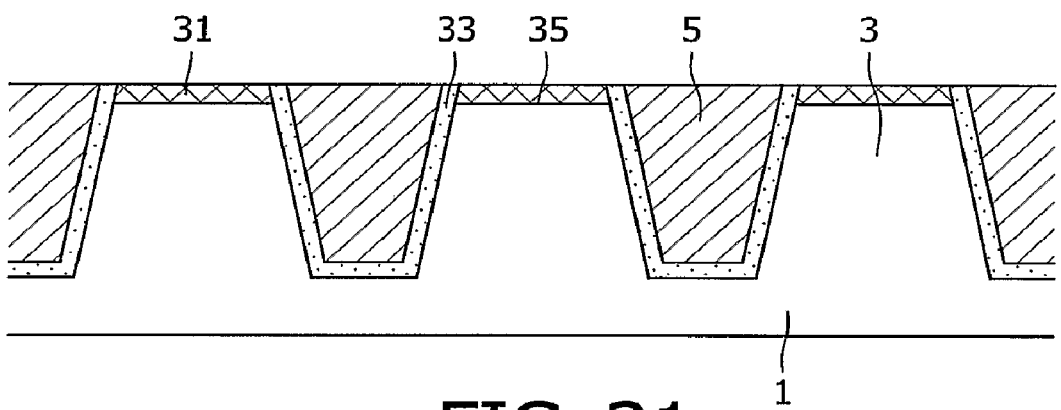
Figure 22:
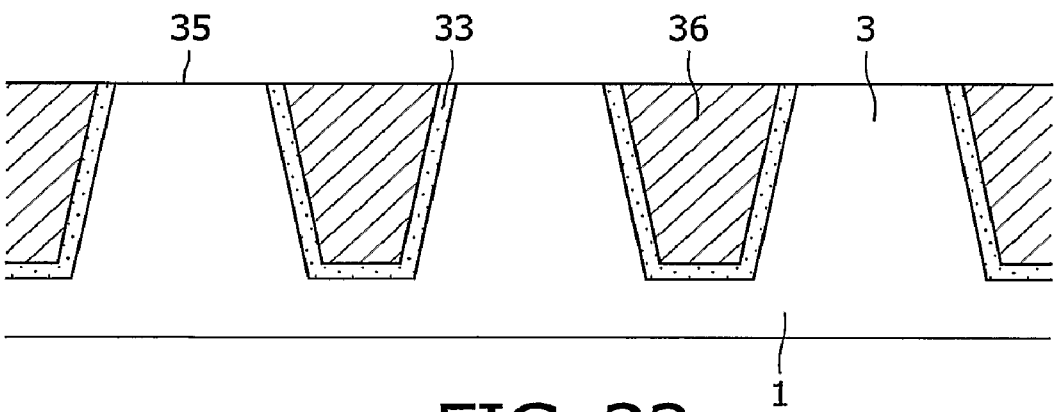

Subsequently, a planarization step, e.g. a chemical-mechanical polishing (CMP) step is performed in order to planarize the surface of the device obtained up to now. In this step, the hard mask 31 can be used as a CMP stop. The process should be tuned to the specific layer stack in the trenches 32. The result after CMP is illustrated in FIG. 21. After CMP, the hard mask 31 may be removed by means of e.g. etching. Prior to this removal, a blanket etch to etch the EG layer 5 and oxide in the trenches 32 to the same height as the active surface 35 has to be performed in order to reduce the final topography. The result is illustrated in FIG. 22. The conductive material lines in the STI zones 2 form the EGs 36.

It should be noted that the process described above is only an example of how to process the device according to the third embodiment of the present invention, based on a standard STI process. Other, more advanced STI processes, e.g. with additional CMP-stop tiles on the STI zones 2, may also be adapted to form the structure as illustrated in FIG. 22.

Figure 23:
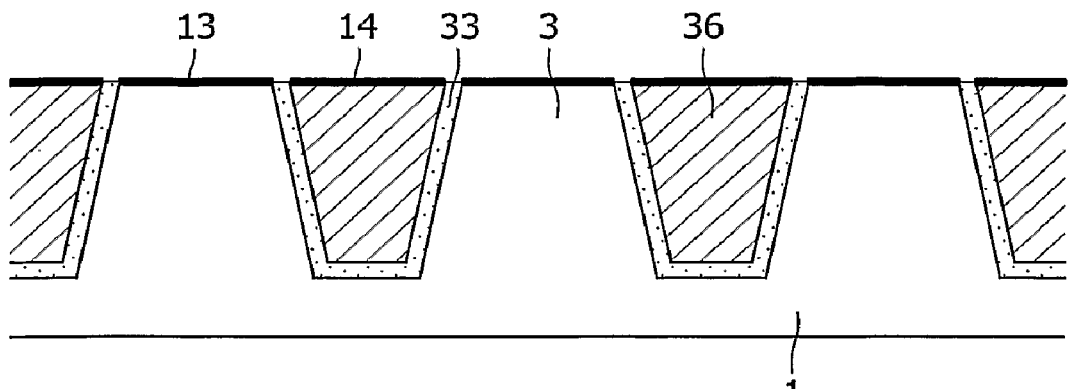

At this stage of the process, well implants, $V_T$ adjust implants and anti-punchthrough implants may be performed as well known by a skilled person (not shown in the drawings). After removal of a sacrificial layer, e.g. a sacrificial oxide layer, used for performing these implantations, an insulating layer such as an oxide layer may be grown, typically by means of thermal oxidation. This causes a tunnel oxide 13 to be formed on top of the active area 3. The tunnel oxide 13 may e.g. have a thickness of 7 to 12 nm. The same oxidation step will also cause an oxide layer, the so-called poly-oxide or EG oxide 14, to be grown on top of the EG 36 (see FIG. 23). The poly-oxide or EG oxide 14 will be thicker than the tunnel oxide 13 because the highly doped EG polysilicon has a higher oxidation rate than the lower doped mono-crystalline silicone substrate 1.

Figure 24:
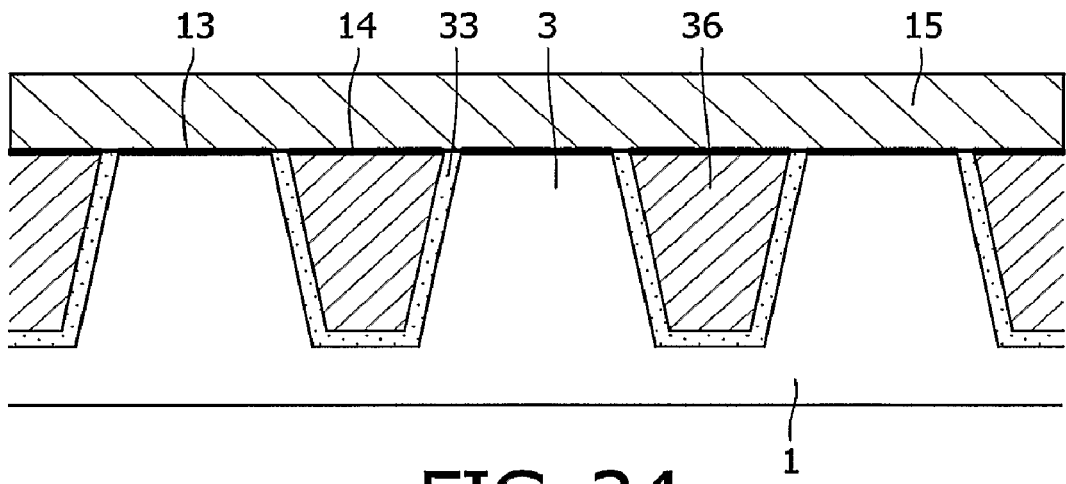

In a next step, a CG/FG stack may be made according to the conventional way. Firstly, a second conductive layer 15 is deposited on top of the structure of FIG. 23. This is illustrated in FIG. 24. The second conductive layer 15 may for example be polysilicon. In the further description, the second conductive layer 15 will be referred to as FG layer 15. Deposition of the FG layer 15 may preferably be done by a CVD procedure, to a thickness between about 50 to 400 nm. Doping of the FG layer 15 may either be accomplished in situ, during deposition, e.g. via the addition of arsine or phosphine to a silane ambient, or via an ion implantation procedure, using for example arsenic, phosphorous or boron ions applied to an intrinsic polysilicon layer. Patterning of the FG layer 15 may be performed by means of a common exposure step. A resist layer (not shown in the figure) is applied on top of the FG layer 15 and some parts thereof (depending on the desired pattern) are exposed. Subsequently, the non-exposed parts (or the exposed parts, depending on the kind of resist used) are washed away, leaving behind a certain pattern of resist, allowing layers not covered by the remaining resist layer to be etched away. After etching, the remaining parts of the resist are removed. In that way, FGs 16 are formed, isolated from each other by means of slits 26, as can be seen from FIG. 25.

Figure 25:
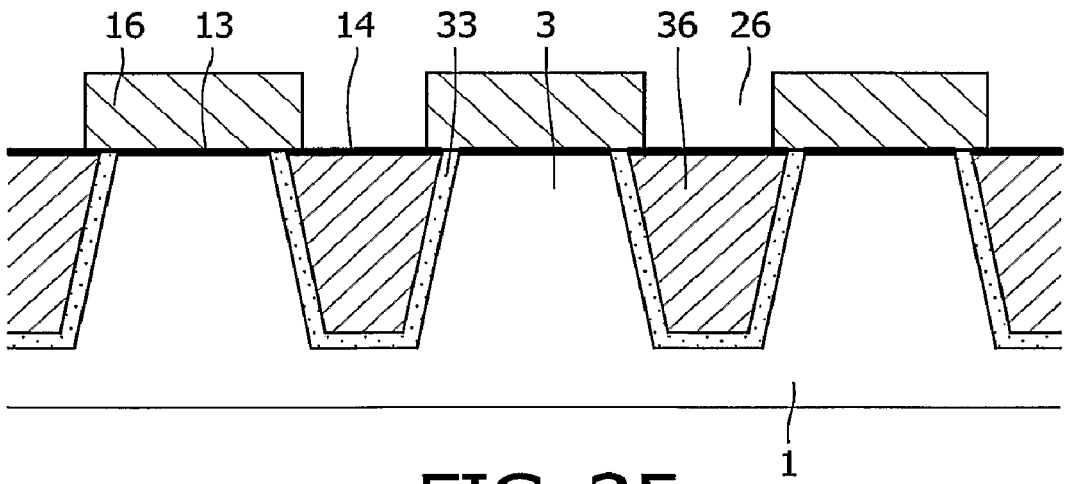
Figure 26:
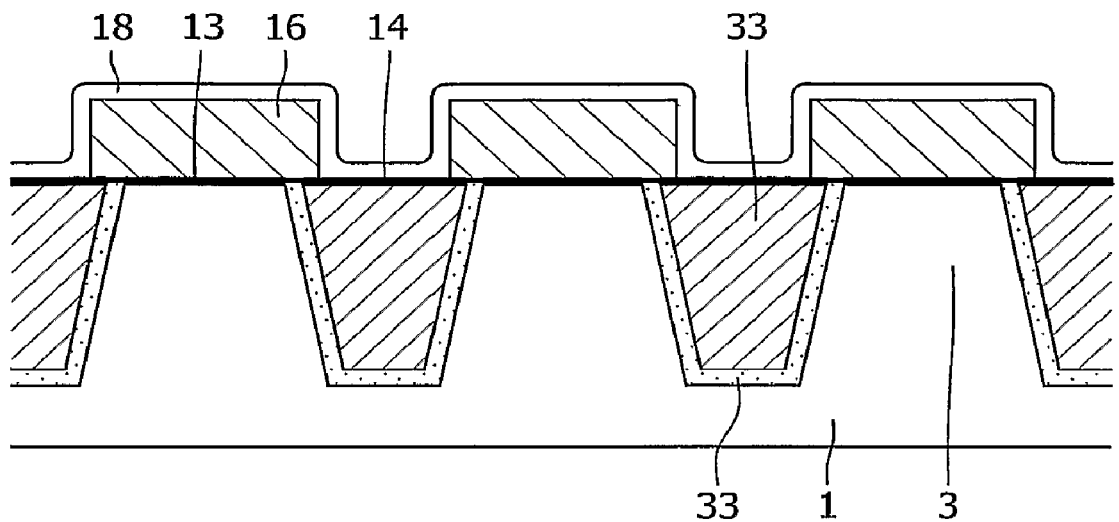

In a next step, illustrated in FIG. 26, an inter-poly dielectric (IPD) layer 18 is applied, e.g. grown or deposited by any suitable technique, on top of the structure of FIG. 25. The IPD layer 18 may preferably be an ONO layer with for example an EOT layer of about 15 nm. The IPD may, however, also be formed out of more advanced materials may be used such as e.g. $HfO_2$ or $Al_2O_5$. These materials show higher k-values than ONO, i.e. for a same thickness they give rise to a higher capacitance and hence, a higher CG-to-FG coupling, with respect to ONO. On top of the IPD layer 18 a third conductive layer 19 may be deposited, from which later on the CG will be formed. The third conductive layer 19 may preferably be a polysilicon layer and in the following description, the third conductive layer 19 will be referred to as the CG layer 19. The deposition of the CG layer 19 may be done by LPCVD processes, to a thickness between about 50 to 400 nm. Doping of the CG layer 19 may either be accomplished in situ, during deposition, via the addition of a suitable dopant impurity such as arsine or phosphine to a silane ambient, or via an ion implantation procedure, using such a dopant, e.g. arsenic, phosphorous or boron ions applied to an intrinsically polysilicon layer.

Optionally, a stack etch may be performed by means of any suitable etch technique known by a skilled person. For compact poly-CMP cells, a nitride capping layer (not shown in the figures) may be deposited on top of the CG layer 19.

Figure 27:
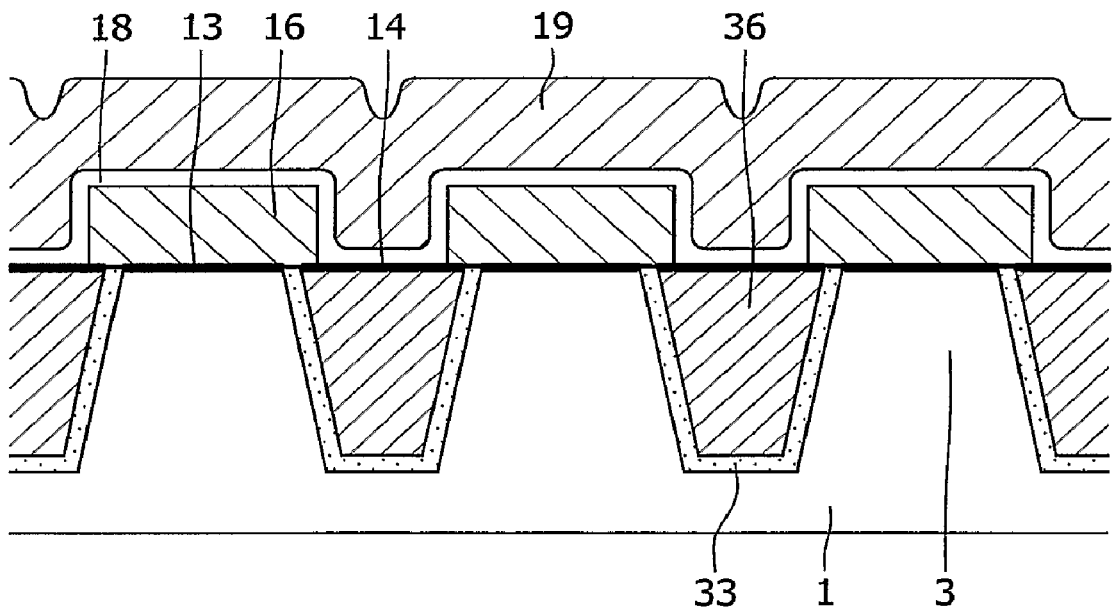

FIG. 27 shows a cross-section along the word line direction of the device. The top view is identical to the top view illustrated in FIG. 11 for the NVM device according to the first embodiment of the invention, apart from the lateral overlap between EG 10 and FG 16 in the approach of the third embodiment.

In contrast with the approach described in the first embodiment of this invention, the EG 10 does not create new topography, as it is completely 'submerged' in the STI zone 2. This means that, starting from the CG/FG/EG stack in FIG. 27, as well 1-T as 2-T and compact cells with or without self-aligned access gates can be made. Hence, the method according to this third embodiment of the invention is thus applicable to 1-T, 2-T and compact FG cells, the latter with or without self-aligned AG 22. In case of 2-T and compact cells, care should be taken not to cause electrical breakdown of the erase gate oxide 14 between the AG 22 and the EG 10 during an erase action, e.g., by biasing the AG 22 positively during erase, although this reduces the efficiency of the erase operation in a compact cell, due to the AG-to-FG coupling. It has to be noted that a misalignment between EG 10 and FG 16 does not result in a change of tunneling area. The changes at the left and at the right cancel each other. However, CD variation of FG 16 or EG 10 directly affect the tunneling area. As this is only a linear effect, whereas the tunnel current depends exponentially on the voltage difference between the EG 10 and the FG 16, this will most likely not result in a large $V_T$ spread.

It is important to mention that the erase gate 10, 36 as formed in a device according to the present invention does not add to the cell size, because it is located on or in STI zones 2. These STI zones 2 are always necessary to separate adjacent floating gates 16.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. A method for manufacturing a semiconductor device comprising an erase gate, a floating gate and a control gate, the method comprising:
   providing a substrate having a substrate surface with at least two isolation zones having an outer surface away from the substrate,
   forming a floating gate extending on the substrate between and at least partially overlapping the two isolation zones,
   forming an erase gate on the outer surface of one of said isolation zones, the erase gate configured to provide an electron-flowing discharge between the floating gate and the erase gate, and
   forming a control gate over the floating gate.

2. A method according to claim 1, wherein providing isolation zones in said substrate comprises providing STI zones.

3. A method according to claim 1, wherein forming a floating gate comprises depositing a conductive layer and etching slits in said conductive layer in order to separate adjacent FGs.

4. A method according to claim 3, wherein etching said slits is performed such that the slits run over substantially the complete width of the substrate.

5. A method according to claim 3, the semiconductor device furthermore comprising an access gate, wherein said method furthermore comprises: depositing a dielectric layer on top of the conductive layer, and before forming the control gate, at least partially removing said dielectric layer at a position where the access gate is to be formed.

* * * * *